United States Patent
Iizuka

(10) Patent No.: US 7,413,611 B2
(45) Date of Patent: *Aug. 19, 2008

(54) GAS REACTION SYSTEM AND SEMICONDUCTOR PROCESSING APPARATUS

(75) Inventor: Hachishiro Iizuka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/565,676

(22) PCT Filed: Jul. 23, 2004

(86) PCT No.: PCT/JP2004/010895

§ 371 (c)(1),
(2), (4) Date: Jan. 24, 2006

(87) PCT Pub. No.: WO2005/010969

PCT Pub. Date: Feb. 3, 2005

(65) Prior Publication Data

US 2006/0180078 A1 Aug. 17, 2006

(30) Foreign Application Priority Data

Jul. 25, 2003 (JP) .............................. 2003-279970

(51) Int. Cl.
C23C 16/00 (2006.01)
(52) U.S. Cl. ...................................... 118/726; 118/715
(58) Field of Classification Search ................. 118/715, 118/726

See application file for complete search history.

(56) References Cited

U.S. PATENT DOCUMENTS

| | | | | | |
|---|---|---|---|---|---|
| 4,188,368 | A | * | 2/1980 | Frosch et al. | 423/350 |
| 5,595,606 | A | * | 1/1997 | Fujikawa et al. | 118/725 |
| 5,776,254 | A | * | 7/1998 | Yuuki et al. | 118/725 |
| 6,036,783 | A | * | 3/2000 | Fukunaga et al. | 118/724 |
| 6,074,487 | A | * | 6/2000 | Yoshioka et al. | 118/726 |
| 6,302,965 | B1 | * | 10/2001 | Umotoy et al. | 118/715 |
| 6,409,839 | B1 | * | 6/2002 | Sun et al. | 118/726 |
| 6,470,144 | B1 | * | 10/2002 | Tarutani et al. | 392/396 |
| 6,517,634 | B2 | * | 2/2003 | Pang et al. | 118/715 |
| 6,596,085 | B1 | * | 7/2003 | Schmitt et al. | 118/726 |
| 6,756,235 | B1 | * | 6/2004 | Liu et al. | 438/3 |
| 2003/0033978 | A1 | * | 2/2003 | Zhao et al. | 118/725 |

FOREIGN PATENT DOCUMENTS

| | | |
|---|---|---|
| JP | 2001-335940 | 12/2001 |
| JP | 2002-535483 | 10/2002 |
| JP | 2004-47887 | 2/2004 |

* cited by examiner

*Primary Examiner*—Michael Cleveland
*Assistant Examiner*—Keath T Chen
(74) *Attorney, Agent, or Firm*—Oblon, Spivak, McClelland, Maier & Neustadt, P.C.

(57) ABSTRACT

A gas reaction system is disclosed which comprises a vaporizer (230) for generating a reaction gas by vaporizing a liquid material and a reaction chamber (221A) wherein the reaction gas is reacted. The vaporizer (230) is integrally formed with a component member which defines the reaction chamber (221A). The reaction gas generated in the vaporizer (230) is directly introduced into the reaction chamber (221A). The vaporization chamber (232) of the vaporizer (230) is a space between an upper plate (230A) and a cap (230B) attached to the upper surface of the upper plate (230A). A narrow passage (233) is formed between the cap (230B) and the upper plate (230A) which passage (233) communicates with the vaporization chamber (232).

17 Claims, 8 Drawing Sheets

GAS REACTION SYSTEM AND SEMICONDUCTOR PROCESSING APPARATUS

FIELD OF THE INVENTION

The present invention relates to a gas reaction apparatus and a semiconductor processing apparatus; more particularly, to a gas reaction apparatus and a semiconductor processing apparatus having a vaporization unit for vaporizing a liquid source material to produce a reaction gas or a processing gas. The term "semiconductor processing" used herein implies various processes to manufacture semiconductor devices and/ or a structure including wiring, electrodes, and the like connected to the semiconductor devices on a substrate to be processed, by forming a semiconductor layer, an insulating layer, a conductor layer and the like, in a predetermined pattern, on the substrate to be processed, e.g., a semiconductor wafer or a glass substrate for LCD (Liquid Crystal Display) or FPD (Flat Panel Display).

BACKGROUND OF THE INVENTION

Generally, in a fabrication line of a semiconductor, a liquid crystal display or the like, a gas reaction apparatus for performing various processes by introducing a source gas into a reaction chamber is utilized. For example, as for a film forming apparatus for forming an insulation thin film on a surface of a substrate to be processed such as a semiconductor wafer or the like, a chemical vapor deposition apparatus (CVD apparatus) for performing a film formation by a gas reaction has been known. Recently, the CVD apparatus is used for forming a multi-component metal oxide thin film such as PZT (lead zirconate titanate).

Generally, since an organic metal compound, which is a source material of a thin film such as PZT or the like, is solid at room temperature under atmospheric pressure, it is necessary to gasify this kind of a solid source material to supply it into a processing chamber to be used in the CVD apparatus. In this case, the solid source material is dissolved into a liquid by using a proper solvent (referred to as a solution source), and vaporized in a vaporizer to be supplied into the processing chamber. Such a source supply method is referred to as a solution vaporizing method. The solution vaporizing method has been actively studied and developed as a promising gasifying method capable of substituting a bubbling method or a solid sublimation method (e.g., see Japanese Patent Laid-open Application No. 7-94426).

Here, an example of forming a ternary metal oxide thin film by the solution vaporizing method will now be discussed. FIG. 10 is a schematic diagram showing an entire conventional gas reaction apparatus (film forming apparatus). As shown in FIG. 10, in a film forming apparatus 100, source material solutions, which are different from each other, are stored in source vessels divided into plural systems, respectively. For example, these source vessels are formed of a source vessel 101a for storing a lead based source material solution; a source vessel 101b for storing a zirconium based source material solution; and a source vessel 101c for storing a titanium based source material solution.

The source material solutions are respectively extracted into supply lines 103a, 103b and 103c to be flown through a main line 107 via respective flow rate controllers 105a, 105b and 105c by a pressurized gas A supplied through a force feed gas line 102. A carrier gas B such as a nonreactive gas (e.g., He, Ar or the like) or the like is supplied into the main line 107 through a flow rate controller 115. The source material solutions are mixed with the carrier gas in the main line 107, and thus transferred to a vaporizer 110 in a gas-liquid mixed state. Further, there is prepared a solvent vessel 101d for accommodating therein a solvent, e.g., butyl acetate, octane or THF (tetrahydrofuran). In the same manner, the solvent accommodated in the solvent vessel 101d is extracted to the supply line 104 by the pressurized gas A to be flown into the main line 107 through a flow rate controller 106.

A nozzle 111 is disposed at the vaporizer 110, to which the main line 107 is connected. Further, a carrier gas C is supplied to the nozzle 111 through a line 108 via a flow rate controller 109. At the nozzle 111, there is provided a nozzle port of a double tube structure. For example, the solution source materials supplied into an inner tube are sprayed into a vaporizing chamber 112 by the carrier gas C supplied into an outer tube. Here, a nozzle part is cooled below a room temperature to prevent the solvent having a low vaporization temperature from being vaporized first since a vaporization temperature of the solvent to be used is different from that of the source material itself, generally.

An inner surface of the vaporizer 112 corresponds to a vaporizing surface 112a for vaporizing the source material, and is heated to about, e.g., 200° C. Misty solution source materials ejected from the nozzle 111 collide with the vaporizing surface 112a to be vaporized instantaneously to become a source gas in the vaporizing chamber 112. The source gas is drained from a gas draining port 113 through a filter 114 to be supplied into a processing chamber 121 of a film forming apparatus main body 120 through a gas transporting line 116. The gas transporting line 116 is heated such that the source gas passing therethrough is not solidified or liquefied.

In the processing chamber 121, there are disposed a showerhead 122 to which the gas transporting line 116 is connected; and a susceptor 123 for mounting thereon a substrate W to be processed. An oxidizing gas, such as $O_2$, $N_2O$, $NO_2$ or the like, which reacts with the source gas in the processing chamber 121, is supplied into the showerhead 122 through a reaction gas supply line 117. In the processing chamber 121, a thin film is formed on the substrate to be processed W by reactions between the source gas and the oxidizing gas.

However, in the conventional film forming apparatus 100, the gas transporting line 116 between the vaporizer 110 and the processing chamber 121 is long so that particles are likely to be produced in the source gas, or a supply amount of source gas is fluctuated, thereby deteriorating the uniformity in a film composition or a film thickness.

Further, an inside of the entire gas transporting line 116 must be heated to a temperature higher than a vaporization temperature of the source and at the same time lower than a decomposition temperature thereof, such that the source gas is not solidified or liquefied during the transportation. In this case, since a heating unit and a temperature control unit are required, the overall structure gets complicated. Moreover, the vaporizer 110, the gas transporting line 116 and the processing chamber 121 need to be heated individually, resulting in an increase of power consumption. In addition, the vaporizer 110 and the gas transporting line 116 need to be equipped with a heating unit, so that the entire apparatus becomes large-scaled.

SUMMARY OF THE INVENTION

It is, therefore, an object of the present invention to provide a gas reaction apparatus and a semiconductor processing apparatus, wherein a high quality gas reaction can be realized and the apparatus can be made simple and small by preventing particles from being produced during the transportation of the source gas.

In accordance with a first aspect of the present invention, there is provided a gas reaction apparatus including: a vaporizer for producing a reaction gas by vaporizing a liquid source material; and a reaction chamber in which the reaction gas reacts, wherein the vaporizer is integrally formed with constituent members forming the reaction chamber, and the reaction gas produced in the vaporizer is directly introduced into the reaction chamber.

In accordance with the gas reaction apparatus of a first aspect, it is unnecessary to prepare a gas transporting line between the vaporizer and the reaction chamber, and to prepare a heating unit for heating the gas transporting line. Further, the transfer distance of the reaction gas becomes shortened to reduce the residence time thereof during the transportation, and thus it is possible to prevent particles being produced during the transportation.

The clause "the reaction gas produced in the vaporizer is directly introduced into the reaction chamber" used herein excludes such a case that the reaction gas is introduced into the reaction chamber after passing through a line at the outside of structure parts forming the vaporizer and the reaction chamber.

In the gas reaction apparatus in accordance with the first aspect, it is preferable that the vaporizer is directly formed at an outer side of a gas introduction unit for introducing the reaction gas into the reaction chamber. The reaction gas produced in the vaporizer is directly introduced into the gas introduction unit disposed at the inner side thereof, so that the path towards the reaction chamber can be further shortened. Therefore, particles can be further reduced, and stability of the reaction gas can be improved. Here, in the gas introduction unit, there are disposed gas inlet openings, opened towards the reaction chamber, for introducing the reaction gas. For example, the gas introduction unit may have a showerhead structure having plural gas inlet openings.

In the gas reaction apparatus in accordance with the first aspect, it is preferable that the vaporizer is formed above the reaction chamber. By this, disassembling operation (maintenance work) of the vaporizer or the gas introduction unit can be readily carried out.

Further, as an entire configuration, it is preferable that the vaporizer and the gas introduction unit are formed as a unit, and the vaporizer as well as the gas introduction unit is configured to be separated from other parts of the structural parts forming the reaction chamber, i.e., configured to be opened or closed.

In the gas reaction apparatus in accordance with the first aspect, it is preferable that the vaporizer contains a spraying nozzle; a vaporizing chamber forming a spraying space of corresponding spraying nozzle; a narrow passageway communicating with corresponding vaporizing chamber; and a draining unit communicating with corresponding narrow passageway and the reaction chamber. In this case, the liquid source material is sprayed into the vaporizing chamber by the spraying nozzle to be vaporized therein, and thus producing the reaction gas. After that, the reaction gas reaches to a draining unit through the narrow passageway, and is introduced into the reaction chamber therefrom. At this time, since the reaction gas produced in the vaporizing chamber passes through the narrow passageway before being introduced into the reaction chamber, the fine mist contained in the source gas is captured in the inner surface of the passageway to thereby be re-vaporized easily. As a result, vaporization efficiency of the reaction gas can be further increased, and at the same time, particles to be introduced into the reaction chamber can be further reduced.

In the gas reaction apparatus in accordance with the first aspect, it is preferable that the narrow passageway is formed of one or more passageways annularly disposed around the vaporizing chamber, and an annular draining passage communicating with the narrow passageway is disposed in the draining unit. In this way, the vaporizer can be made thin. Further, sufficient flow path cross sectional area of the narrow passageway can be obtained without making the apparatus large. Still further, the annular draining passage communicating with the narrow passageway is disposed, so that sufficient conductance of the reaction gas passing through the narrow passageway can be secured. Thus, a residing part of the gas is hardly generated in the introduction passage of the reaction gas to the reaction chamber, so that particles to be introduced into the reaction chamber can be further reduced. Here, it is preferable that the annular draining passage is disposed around the narrow passageway to make the vaporizer smaller, and coaxially configured with the narrow passageway.

In the gas reaction apparatus in accordance with the first aspect, it is preferable that a heater unit for heating inner surfaces of the vaporizing chamber and the narrow passageway is further included. In this way, vaporization action can be obtained in the inner surface of the vaporizing chamber, and the mist can be also vaporized in the inner surface of the narrow passageway. Therefore, vaporization efficiency of the reaction gas can be increased, and at the same time, particles can be reduced. Here, in case where the vaporizer is directly formed at the outer side of the gas introduction unit, the gas introduction unit may be simultaneously heated by the heater unit, as well.

In the gas reaction apparatus in accordance with the first aspect, it is preferable that a filter for capturing solid or liquid phase materials in the reaction gas is disposed inside the draining passage. Since solid or liquid phase materials in the reaction gas can be captured by the filter, particles to be introduced into the reaction chamber can be further reduced. Further, since the filter is disposed inside the draining passage, sufficient filter area can be secured. Still further, since the filter is disposed at a downstream side of the narrow passageway having capture capability of the mist, the filter can be prevented from being clogged.

In the gas reaction apparatus in accordance with the first aspect, it is preferable that the filter is disposed at a draining port of the draining passage, which communicates with the reaction chamber. In this way, the space for installing the filter is minimally restricted, so that solid or liquid phase materials in the reaction gas can be securely captured.

In the gas reaction apparatus in accordance with the first aspect, it is preferable that a valve body for opening or closing the draining port is disposed, and the filter is disposed to surround the valve body. By this, the draining port can be opened or closed by the valve body. Further, since the filter is disposed to surround the valve body, the filter can be accommodated in the space where the valve body is accommodated, and thus the vaporizer can be formed more compactly.

In the gas reaction apparatus in accordance with the first aspect, it is preferable that a heater unit for heating the filter is included. By this, the mist captured by the filter is vaporized, so that vaporization efficiency can be enhanced, and at the same time, the filter can be prevented from being clogged.

In the gas reaction apparatus in accordance with the first aspect, it is preferable that the filter makes a thermal contact with an inner surface of the draining passage, and heated by the heater through the inner surface of the draining passage.

In this way, since the heater unit can be disposed at the outer side of the draining passage, degree of freedom for placing the heater can be increased, and at the same time, the draining passage can be made compact. The heater may be in common with the heater for heating the vaporizing chamber.

In the gas reaction apparatus in accordance with the first aspect, it is preferable that a heat transfer unit, thermally contacted with a portion other than edges of the filter, is disposed at the draining passage. By this, the filter can be more uniformly heated, so that vaporization efficiency can be increased, and at the same time, local clogging of the filter can be reduced. As for the heat transfer unit, there may be used, e.g., a protrusion protruded from the inner surface of the draining passage to be contacted with the filter surface.

In accordance with a second aspect of the present invention, there is provided a semiconductor processing apparatus, including: a vessel forming a processing chamber for processing a substrate to be processed, the vessel having a upper plate capable of being attached thereto and detached therefrom; a supporting member, disposed inside the vessel, for supporting the substrate to be processed; a showerhead for supplying a processing gas into the processing chamber, the showerhead being disposed below the upper plate to face the substrate supported by the supporting member; a vaporizing chamber, disposed on the upper plate, for producing the processing gas by vaporizing a liquid source material; and a gas passage, configured to connect the vaporizing chamber with the showerhead through the upper plate, for flowing the processing gas.

DETAILED DESCRIPTION OF THE PREFERRED EMBODIMENTS

Figure 1:
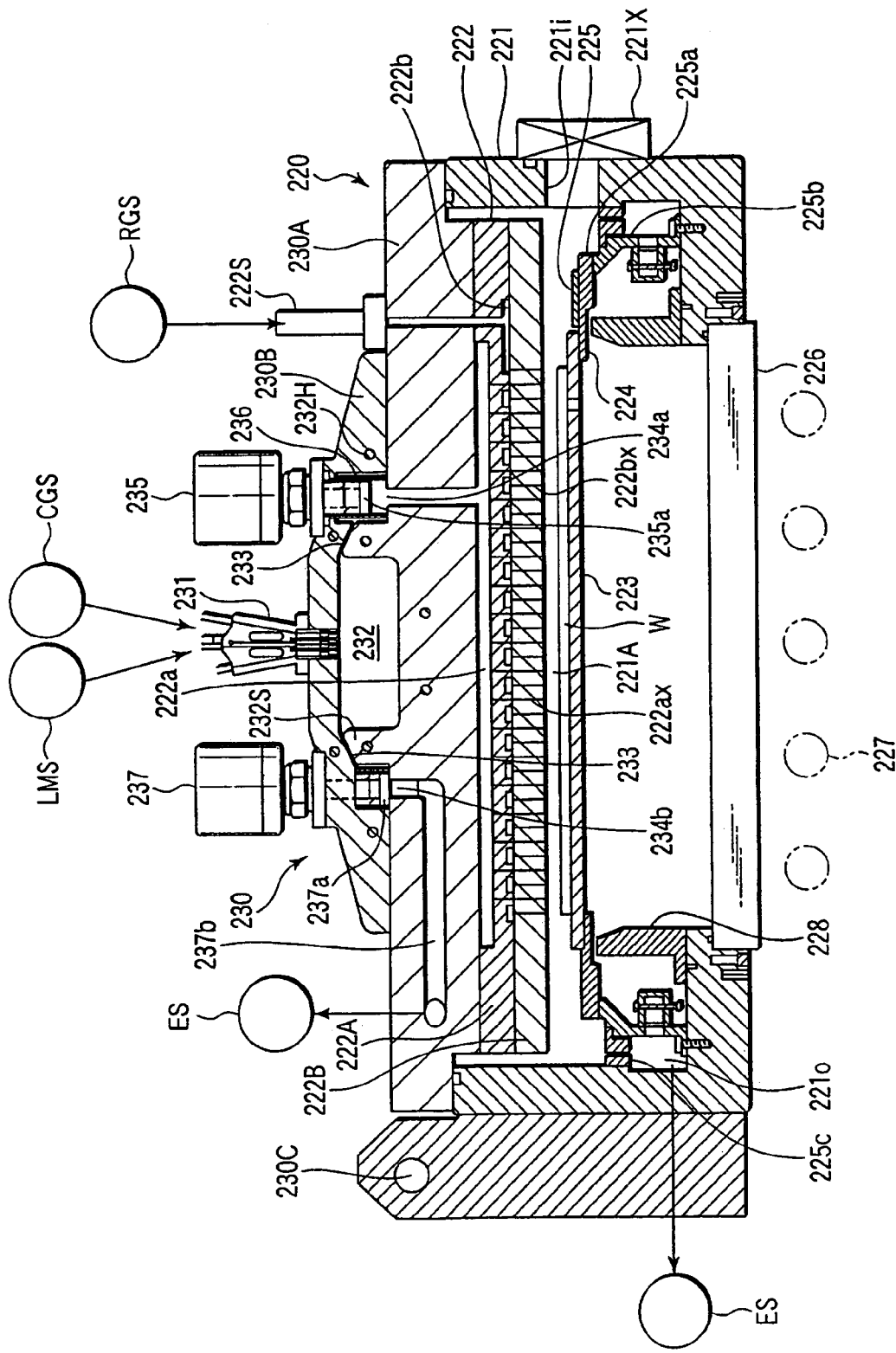
FIG. 1 offers a schematic vertical cross sectional view for showing a main body of a gas reaction apparatus (semiconductor processing apparatus) in accordance with a preferred embodiment of the present invention.

Preferred embodiments of the present invention will be described in detail with reference to the accompanying drawings. Further, parts having substantially same functions and configurations are designated by same reference numerals, and their redundant explanations will be omitted unless necessary.

A gas reaction apparatus (semiconductor processing apparatus) in accordance with an embodiment explained hereinafter is formed as a film forming apparatus (CVD apparatus) for performing a film formation on a substrate to be processed W in a reaction chamber. However, the present invention may be applied to other gas reaction apparatus (semiconductor processing apparatus), e.g., a dry etching apparatus, a plasma ashing apparatus or the like, having a vaporizing unit for producing a reaction gas or a processing gas by vaporizing a liquid source material.

FIG. 1 presents a schematic vertical cross sectional view for showing a main body of a gas reaction apparatus (semiconductor processing apparatus) in accordance with a preferred embodiment of the present invention. As shown in FIG. 1, a film forming apparatus main body 220 includes a vessel casing 221 whose upper portion is opened. A gas introduction unit (showerhead) 222 is disposed at the upper portion of the vessel casing 221. A susceptor (substrate holder) 223 is arranged in the vessel casing 221. Here, a reaction chamber (processing chamber) 221A is formed in a space between the gas introduction unit 222 and the susceptor 223. An exhaust system (ES) is connected to the vessel casing 221 through an exhaust space 221o. The reaction chamber 221A is exhausted by the exhaust system (ES) to be depressurized.

The susceptor 223 is supported by a ring shaped supporting body 224 made of, e.g., AlN, $Al_2O_3$, quartz or aluminum. On the supporting body 224, there is disposed a shield ring 225 made of quarts or the like. The supporting body 224 is supported by a shield base 225b through an attachment 225a. A circular flow rectifying plate 225c is fitted to an outer periphery of the shield base 225b. The reaction chamber 221A communicates with the exhaust space 221o through the flow rectifying plate 225c.

A window member 226 made of quartz or the like is furnished under the susceptor 223. Heating lamps 227 are disposed outside (below) the window member 226. Light from the heating lamps 27 is irradiated to a lower surface of the susceptor 223 through the window member 226 to heat the susceptor 223. An annular reflector 228 for reflecting light irradiated from the heating lamps 227 is disposed between the susceptor 223 and the window member 226. A temperature sensor such as a thermocouple is introduced into the susceptor 223 from the outside. A ceramic heater, which is made of $Al_2O_3$, AlN, SiC and the like and formed by embedding a resistor in the susceptor 223, can be used as the heat source.

In the vessel casing 221, a loading port 221i is configured to be opened or closed by a gate valve 221X. A lift mechanism (not shown) is disposed in the vessel casing 221, and multiple lifter pins can be popped out from or popped into the susceptor 223 by the lift mechanism.

The substrate to be processed (e.g., semiconductor wafer or the like) W is loaded into the vessel casing 221 through the loading port 221i by a transfer unit (not shown), when performing a film forming processing on the substrate to be processed. The loaded substrate W is supported by the lifter pins of the lift mechanism protruded from the susceptor 223. Subsequently, the lifter pins are popped into the susceptor 223, so that the substrate to be processed W is mounted on the susceptor 223. When the film forming processing on the substrate to be processed W is completed, the lifter pins of the lift mechanism are popped out to lift the substrate to be processed W upward from the susceptor 223. Then, the substrate to be processed W is supported by the transfer unit and unloaded to the outside through the loading port 221*i*.

An upper opening of the vessel casing 221 is airtightly closed with an upper plate 230A. The gas introduction unit (showerhead) 222 is integrally placed on a lower surface of the upper plate 230A. On the lower surface of the upper plate 230A, there are placed a middle plate 222A and a lower plate 222B to form the showerhead 222. A source gas diffusion space 222*a* is formed between the middle plate 222B and the upper plate 230A. From the source gas diffusion space 222*a*, there are extended plural source gas supply paths 222*ax* communicating with the reaction chamber 221A through the middle 222A and the lower plate 222B.

A reaction gas diffusion space 222*b* is formed between the middle plate 222A and the lower plate 222B. From the reaction gas diffusion space 222*b*, there are extended plural reaction gas supply paths 222*bx* communicating with the reaction chamber 221A through the lower plate 222B. The reaction gas diffusion space 222*b* is connected to a reaction gas supply unit (RGS) through a reaction gas supply line 222S extending from the top surface of the upper plate 230A. From the reaction gas supply unit (RGS), there is introduced a reaction gas (e.g., an oxidizing gas such as $O_2$, $N_2O$, $NO_2$ or the like) into the reaction gas diffusion space 222*b*.

A vaporizer 230 is disposed on the upper plate 230A, i.e., above the gas introduction unit 222. On the top surface of the upper plate 230A, there is formed a protrusion 232S defining a sidewall of the vaporizing chamber 232 to form a vaporizing chamber 232 of the vaporizer 230. Namely, a recess of the vaporizing chamber 232 is formed on the top surface of the upper plate 230A by the protrusion 232S. On the upper plate 230A, there is disposed a cap 230B, which can be airtightly attached thereto or detached therefrom, to cover the protrusion 232S. The vaporizing chamber 232 is formed as a space surrounded by the protrusion 232S between the upper plate 230A and the cap 230B. For an efficient vaporization, an inner surface of the sidewall of the vaporizing chamber 232 may be of a recessed and curved shape, a hemisphere shape, or a semi-elliptic shape.

One or more heaters (heating unit) 233H are disposed in at least one of the upper plate 230A and the cap 230B. By the heaters 232H, the upper plate 230A and the cap 230B as well as the vaporizing chamber 232 are heated. It is preferable that the heaters 232H are disposed in the upper plate 230A and the cap 230B, respectively. In case of forming PZT, BST or the like on the silicon substrate, the heaters 232H are controlled such that a temperature of a vaporizing surface 232*a* that will be described later is in a range of 180~250° C., preferably in a range of 200~220° C. The gas introduction unit 222 is also heated by the heaters 232H, so that a temperature of the source gas in the gas introduction unit 222 is maintained at a specified temperature.

A spraying nozzle 231 is fixed at the center of the cap 230B. A nozzle port of the spraying nozzle 231 is disposed to face the inside of the vaporizing chamber 232. To the spraying nozzle 231, there are connected a liquid source material supply unit LMS of a liquid material mixed with the carrier gas and a carrier gas supply unit CGS. Theses supply units are substantially same as those in FIG. 10.

A narrow passageway 233 is formed between the top surface of the protrusion 232S of the upper plate 230A and the inner surface of the cap 230B. More specifically, both the top surface of the protrusion 232S and the inner surface of the cap 230B are coned surfaces which are opposite to each other to have therebetween a fine gap forming the narrow passageway 233. Therefore, the narrow passageway 233 has an annular shape to surround the vaporizing chamber 232. As described below, the narrow passageway 233 serves as a path for vaporizing a mist contained in a vaporized gas.

Further, an annular drain passage 234 is coaxially formed around the narrow passageway 233. In one portion of the drain passage 234, there is formed a drain port 234*a* communicating with the reaction chamber 221A through the gas introduction unit 222. An opening/closing valve 235 is disposed at the cap 230B to open or close the drain port 234*a*. A valve body 235*a* of the opening/closing valve 235 is placed towards the draining port 234*a*.

Between the drain port 234*a* and the narrow passageway 233, there is disposed a filter 236 for capturing the mist (solid or liquid phase material in the vaporized gas). More specifically, the filter 236 is placed to surround an outlet 233*a* of the narrow passageway 233. Further, in another portion of the drain passage 234, there is disposed a gas exhaust port 234*b* to which an exhaust system (ES) is connected through a gas exhaust path 237*b*. An opening/closing valve 237 is disposed at the gas exhaust path 237*b* to exhaust an inside of the drain passage 234. A valve body 237*a* of the opening/closing valve 237 is disposed to face the gas exhaust port 234*b*.

In the present embodiment, one drain port has been disposed, but two or more drain ports may be disposed in the drain passage 234. In the same manner, one gas exhaust port has been disposed, but two or more gas exhaust ports may be placed.

The upper plate 230A is configured as a lid, which can be opened or closed around a hinge 230C equipped in an upper edge of the vessel casing 221. Thus, the upper plate 230A and the cap 230B can be rotated as a unit around the hinge 230C with respect to the vessel casing 221. In other words, the vaporizer 230 and the gas introduction unit 222 are formed as a part of a lid structure, which can open or close the upper opening of the vessel casing 221. Therefore, the vaporizer 230 and the gas introduction unit 222 can be opened or closed as a unit for the vessel casing 221. Moreover, the part forming the vaporizer 230 and the part forming the lid or the gas introduction unit 222 may be configured to be fixed with respect to each other.

Figure 2:
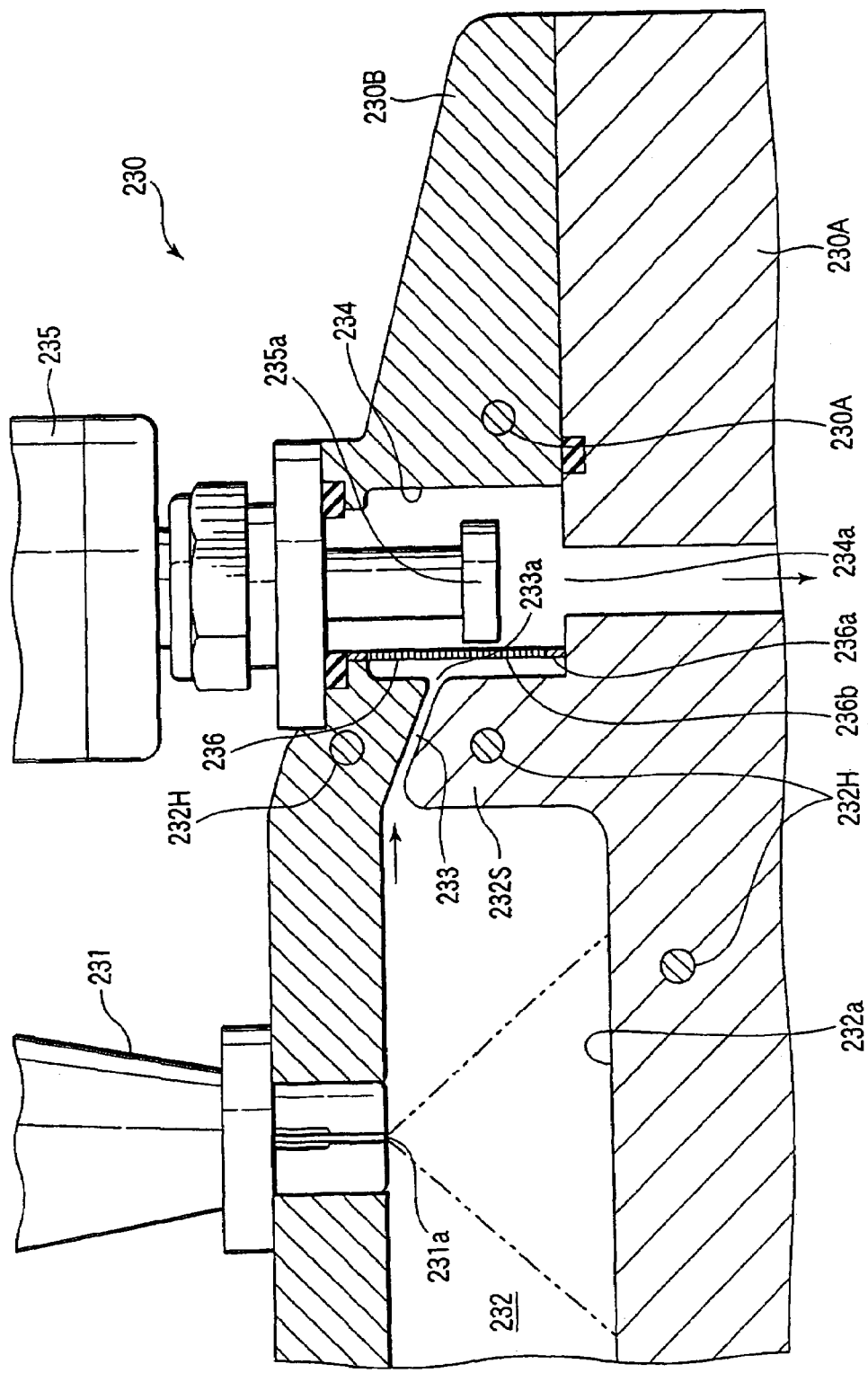
FIG. 2 shows a magnified cross sectional view showing one portion of a vaporizer in the main body described in FIG. 1

FIG. 2 presents a magnified cross sectional view showing portions from the vaporizing chamber 232 to the draining port 234*a* of the draining passage 234 in the vaporizer 230 of the main body described in FIG. 1. As described in FIG. 2, mist of a liquid source material is sprayed into the vaporizing chamber 232 from the nozzle port 231*a* of the spraying nozzle 231. The liquid source material is vaporized instantaneously by colliding with a vaporizing surface 232*a* heated by the heaters 232H, to thereby become a source gas (reaction gas). The pressure gradient caused by the depressurization in the reaction chamber 221A makes the source gas flow through the narrow passageway 233 formed around the vaporizing chamber 232 to be introduced into the draining passage 234.

As mentioned above, the narrow passageway 233 is opened on the uppermost portion of the vaporizing chamber 232. Thus, the mist sprayed from the nozzle port 231*a* is hardly injected into the narrow passageway 233 directly. Moreover, fine mist (droplet) that is left without being vaporized when sprayed mist collided with the vaporized surface 232*a* is hard to reach to the filter 236. For the same reason, the filter 236 is hardly clogged, so that the life span thereof gets prolonged.

Further, the narrow passageway 233 is configured to be extended slightly tilted downwardly from the opening to the vaporizing chamber 232. In this way, the mist reached at the opening of the narrow passageway 233 is likely to make a contact with the inner surface of the narrow passageway 233. Therefore, it is possible to prevent the mist from passing through the narrow passageway 233 to reach the draining passage 234. Since the inner surfaces (upper and lower surfaces) of the narrow passageway 233 are heated by the heaters 232H like as the vaporizing surface 232a, the mist having contacted with the inner surfaces of the narrow passageway 233 is also vaporized therein, to thereby produce the source gas.

In the present embodiment, the annular narrow passageway 233 is formed as a unit around the vaporizing chamber 232, but multiple narrow passageways may be annularly (radially) disposed around the vaporizing chamber 232. Since the narrow passageway 233 is annularly formed around the vaporizing chamber 232, sufficient flow path cross sectional area can be secured as a whole even though a width of the narrow passageway 233 (a width in the narrowest direction, a vertical width in the drawing) is small.

It is preferable that the width of the narrow passageway 233 (vertical width) is about, e.g., 0.5~10.0 mm. Moreover, the width of the passageway (vertical width) may be configured such that the pressure difference between the vaporizing chamber 232 and the reaction chamber connected thereto is about 1.0~4.5 kPa. If the pressure difference is below the above range, the passageway is likely to be clogged. If the pressure difference is beyond the above range, re-vaporizing capability is drastically lowered. In particular, it is preferable that the width of the passageway (vertical width) is larger (longer distance) than the mean free path ($\lambda$) of the mist (e.g., about 10 μm~100 μm of particle diameter).

The draining passage 234 is annularly formed along the outer periphery of the vaporizing chamber 232 while having therebetween the narrow passageway 233. The draining passage 234 is disposed such that the source gas is introduced thereto through the annular narrow passageway 233 and discharged through the draining port 234a. Thus, it is preferable that the draining passage 234 has a sufficient conductance. In the drawing, the vertical width of the draining passage 234 is substantially equal to that of the vaporizing chamber 232. The aforementioned valve body 235a is disposed above the draining port 234a of the draining passage 234 such that it can move vertically. If the valve body 235a is lowered to reach the bottom portion of the draining passage 234, the draining port 234a is to be completely shut. On the other hand, if the valve body 235a is elevated, conductance of the draining port 234a is accordingly increased.

The filter 236 is of a barrel shape (cylindrical shape in the drawing) as a whole, and installed inside the draining passage 234 to surround the outlet 233a of the narrow passageway 233. More specifically, the filter 236 is disposed in the draining passage 234 to annularly surround the outer side of the narrow passageway 233. Instead of the filter 236, a filter 236' (see FIG. 3) that will be discussed later may be employed.

The filter 236 has a mesh structure formed by a fibrous material of a metal or the like, a nonwoven fabric structure formed by a mass of fibrous material or a porous structure having a plurality of fine holes. More specifically, the filter 236 includes metal supporting frames 236a disposed in an upper and a lower portion thereof; and a filter material 236b fixed to the supporting frames 236a. The upper and lower supporting frames 236a are fixed to the top surface of the draining passage 234 (e.g., the inner surface of the cap 230B) and the bottom surface thereof (i.e., the inner surface of the upper plate 230A), respectively.

The filter 236 captures the fine mist or the particles contained in the source gas introduced into the draining passage 234, to prevent the particles from being injected into the reaction chamber 221. The filter 236 is also heated by the heats from the upper plate 230A and the cap 230B. Thus, at least a part of the fine mist captured by the filter 236 is vaporized to become the source gas.

In the above-described configuration, at the initial stage of the operation of the vaporizer 230, the draining port 234a is closed by the opening/closing valve 235 and the gas exhaust port 234b is opened by the opening/closing valve 237. Then, the liquid source material is sprayed from the spraying nozzle 231, and the source gas produced in the vaporizing chamber 232 is discharged through the gas exhaust port 234b via the narrow passageway 233 and the draining passage 234. If the vaporizing state of the vaporizer 230 is sufficiently stabilized, the draining port 234a is opened by the opening/closing valve 235 while at the same time, the gas exhaust port 234b is closed by the opening/closing valve 237. In this way, the source gas is introduced into the reaction chamber 221A through the gas introduction unit 222.

As for the source gas introduced through the gas introduction unit 222, there are enumerated, other than an organic metal compound gas such as Pb, Zr, Ti or the like, an organic metal gas for film formation such as $Al_2O_3$, $HfO_2$, RuO, ZrO, SBT, BLT, PLZT, STO or the like; a high melting point metal compound gas such as $TiCl_4$ (tetrachlroride titanium), $WF_6$ (hexafluoride tungsten), $Ta(OC_2H_5)_5$ (pentaethoxytantalum) or the like; an organic silicon compound gas such as a pentaethoxysilane or the like. Further, there is introduced into the gas introduction unit 222 a predetermined appropriate additional reaction gas other than the source gas supplied by the vaporizer 230. As for such an additional reaction gas, there may be enumerated a reducing gas such as $H_2$, $NH_3$, $SiH_4$ or $SiH_2Cl_2$; or an oxidizing gas such as $O_2$, $O_3$, $N_2O$, $NO_2$, $H_2O$ or the like.

In the present embodiment, the vaporizer 230 is formed as a unit for the reaction chamber 221A, so that it is unnecessary to prepare a long gas transporting line between the vaporizer 230 and the reaction chamber 221A. Therefore, there will be a reduced concern that particles are produced during the transportation of the source gas over a long transfer distance. Moreover, it is unnecessary to heat the line for preventing the source gas from being solidified or liquefied in the gas transporting line.

Further, the vaporizer and the reaction chamber need not be installed individually and connected to each other by the line, so that the entire apparatus can be configured compactly. In particular, the vaporizer 230 is formed as a unit at an outer side of the gas introduction unit 222, so that the source gas produced in the vaporizer 230 can be directly introduced into the gas introduction unit 222. Further, the transfer distance of the source gas from the vaporizer 230 to the reaction chamber 221A can be made short. Thus, production of the particles can be further suppressed, and the supply of the source gas becomes stable. Since the organic metal source gas for use in the film formation of PZT, BST or the like is very expensive, shortening the transfer path of the source gas can prevent waste of the source gas.

In such a configuration, the vaporizer 230 should be thinner to make the entire apparatus more compact. Therefore, in the present embodiment, the narrow passageway 233 is annularly disposed around the vaporizing chamber 232, and the draining passage 234 is coaxially disposed around the narrow passageway 233, as mentioned above. By doing this, it is possible to make the vaporizer 230 very thin while securing sufficient conductances for the vaporizing chamber 232, the narrow passageway 233 and the draining passage 234. Moreover, since the outlet 233a of the narrow passageway 233 is surrounded by the filter 236, the filter 236 can be replaced and cleaned by detaching the cap 230B.

Figure 3:
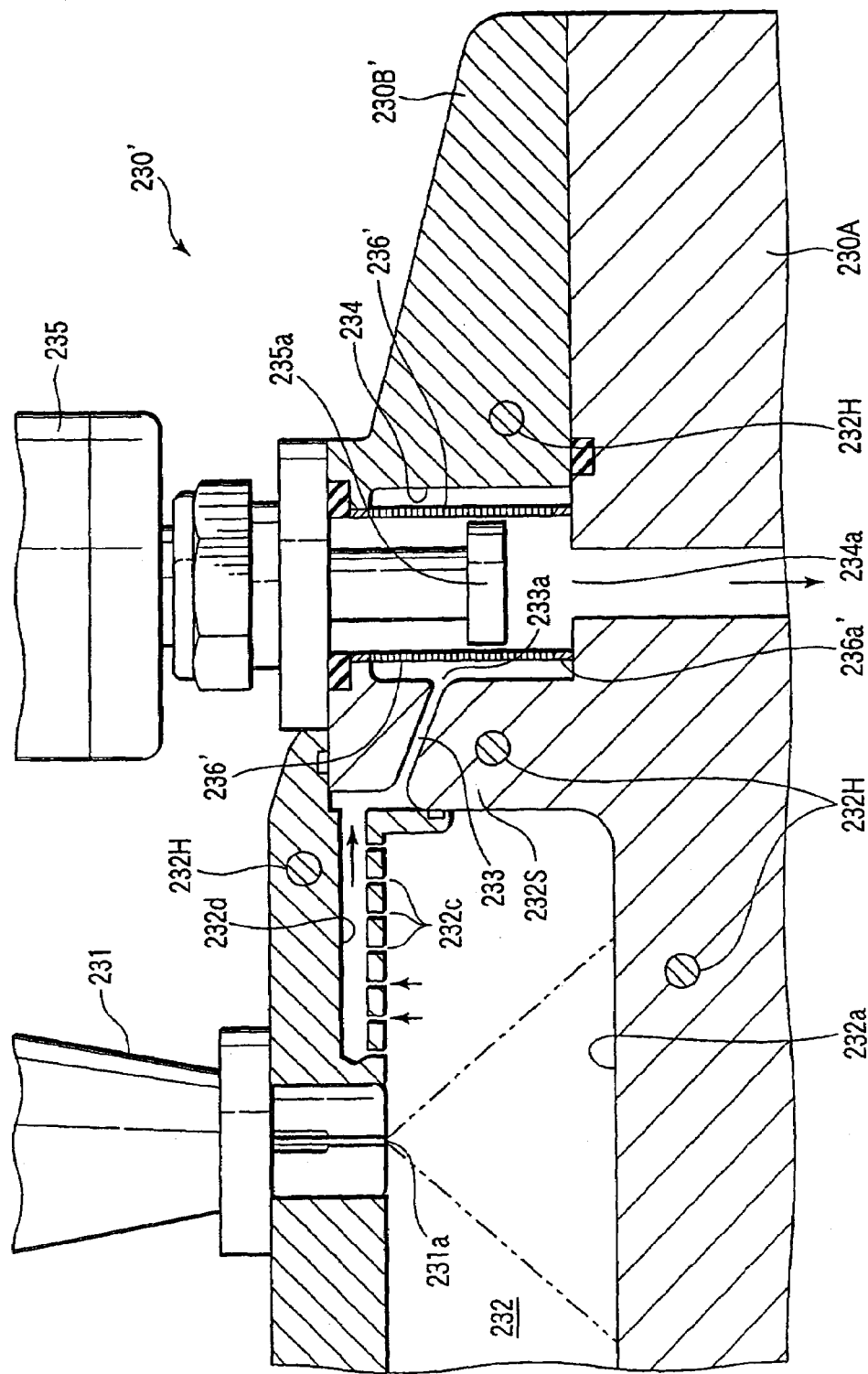
FIG. 3 explains a magnified cross sectional view showing one portion of a modified exemplary vaporizer described in FIG. 2.

FIG. 3 presents a magnified cross sectional view showing one portion of a modified exemplary vaporizer 230' described in FIG. 2. In the vaporizer 230', a modified cap 230B' is prepared; and multiple fine holes 232c are formed at an upper portion of the vaporizing chamber 232 (the wall surface where the spraying nozzle 231 is installed). These fine holes 232c communicate with an introduction passage 232d, which communicates with the narrow passageway 233 as formed above.

In the vaporizer 230', the mist sprayed by the spraying nozzle 231 is vaporized in the vaporizing chamber 232, and the generated source gas is introduced into the introduction passage 232d through the fine holes 232c. Then, the source gas flows into the narrow passageway 233 through the introduction passage 232d. After that, the source gas is discharged through the draining port 234a via the draining passage 234, and supplied into the reaction chamber 221A through the gas introduction unit 222, same as in the aforementioned embodiment.

It is preferable that the fine holes 232c and the introduction passage 232d are annularly configured around the spraying nozzle 231 at the upper portion of the vaporizing chamber 232. Moreover, the multiple fine holes 232c and the introduction passage 232d may be annularly (radially) arranged at the upper portion of the vaporizing chamber 232. In this way, sufficient conductances can be secured in the gas paths towards the narrow passageway 233.

In the fine holes 232c and the introduction passage 232d, the fine mist contained in the source gas, which is produced in the vaporizing chamber 232, is captured to be re-vaporized. Thus, it is possible to reduce the fine mist in the source gas introduced into the narrow passageway 233, so that vaporization efficiency can be further increased, and at the same time, generation of the particles can be further suppressed. Moreover, in this way, the narrow passageway 233 or the filter 236 disposed in the downstream side can be prevented from being clogged.

In the present modified example, the filter 236' is of a tube shape (a cylindrical shape in the drawing) as a whole, and installed in the draining passage 234 to surround the valve body 235a and the draining port 234a. More specifically, the filter 236' is disposed inside the draining passage 234 while having its axis aligned vertically and accommodating the draining port 234a inside one opening thereof. Another opening periphery of the filter 236' makes a contact with the upper portion of the draining passage 234. In the barrel shaped filter 236', the valve body 235a is accommodated in such a manner that it can move in the vertical direction, i.e., in the axis direction.

As described above, the filter 236' is disposed in the portion where the valve body 235a of the opening/closing valve 235 is accommodated, so that the filter 236' can be installed by using the portion where the valve body 235a is accommodated. Thus, it is possible to compactly accommodate the filter 236' without making the draining passage 234 too large. Moreover, the filter 236' can be easily replaced or cleaned by disassembling the opening/closing valve 235. In case of using a bellows valve, the source gas is adhered to a bellows of the valve body 235a to change the bellows, which in turn prevents the generation of the particles. Meanwhile, in the present modified example, the aforementioned filter 236 may be employed instead of the filter 236'.

Figure 4:
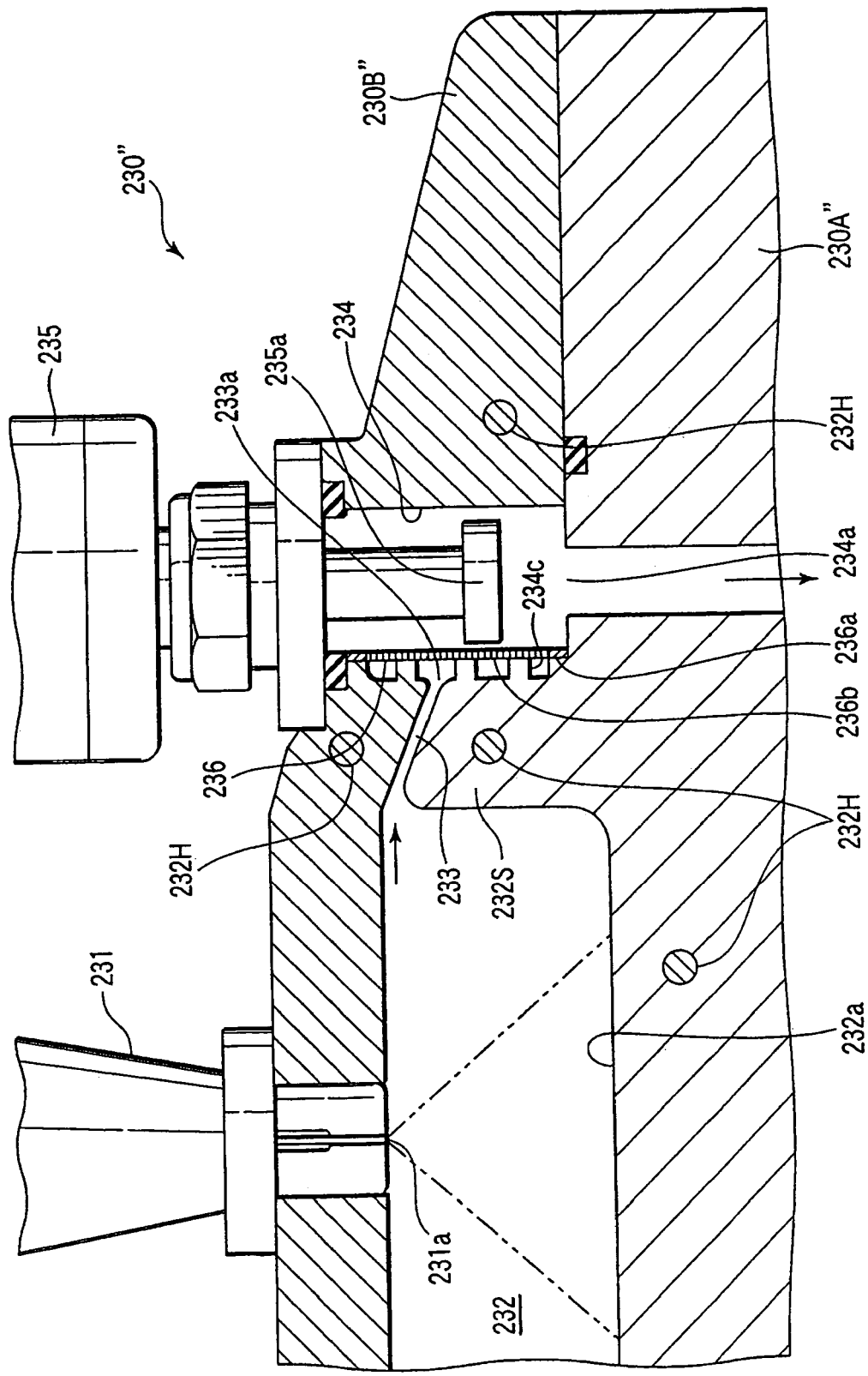
FIG. 4 sets forth a magnified cross sectional view showing one portion of an additional modified exemplary vaporizer described in FIG. 2.

FIG. 4 is a magnified cross sectional view showing one portion of another modified exemplary vaporizer 230" described in FIG. 2. In the vaporizer 230", a modified upper plate 230A" and a cap 230B" are prepared; and multiple protruded heat transfer units 234c are formed at an inner surface of the draining passage 234", i.e., a portion where the filter 236 is installed. These multiple heat transfer units 234c make contacts with the surface of a filter material 236b; and contact portions thereof are disposed to be substantially uniformly dispersed.

The heat transfer units 234c make thermal contacts with the filter surface of the filter 236, so that heat transfer is readily conducted from the upper plate 230A" and the cap 230B" to the filter 236, and at the same time, the entire filter surface is more uniformly heated. Thus, accuracy and uniformity of the temperature are improved over the filter surface. Therefore, the mist in the filter 236 is facilitated to be re-vaporized, and the filter is further prevented from being clogged. Meanwhile, in the present modified example, the filter 236' may be used instead of the filter 236.

Figure 5A:
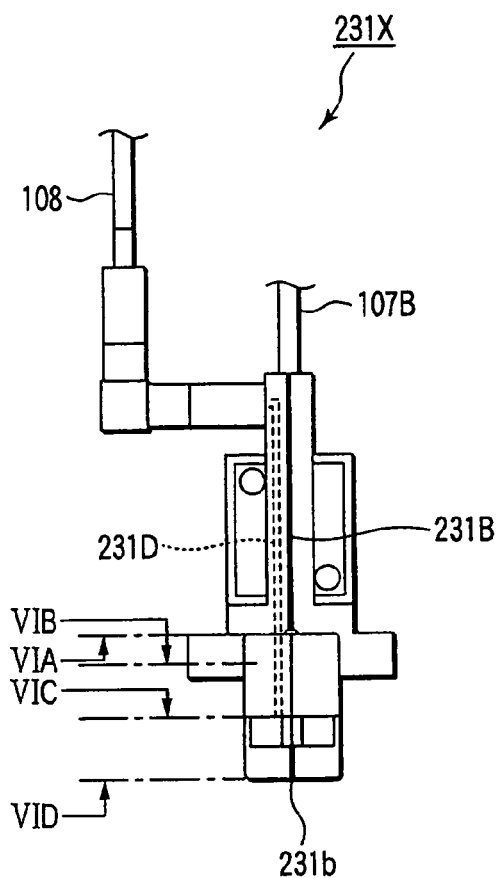
FIGS. 5A and 5B are of a vertical side view and a vertical front view, respectively, for schematically showing a spraying nozzle that may be used in the vaporizers described in FIGS. 2 to 4.
Figure 5B:
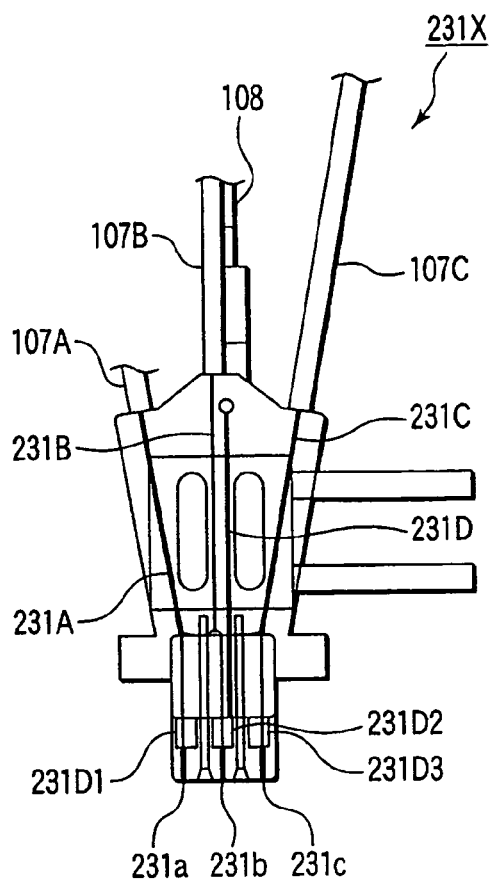
Figure 6A:
FIGS. 6A to 6D provide cross sectional views taken along the lines VIA, VIB, VIC and VID of FIG. 5A, respectively.
Figure 6B:
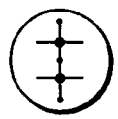
Figure 6C:
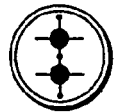
Figure 6D:
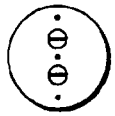

FIGS. 5A and 5B are of a vertical side view and a vertical front view, respectively, for schematically showing a spraying nozzle that may be used in the vaporizers described in FIGS. 2 to 4. FIGS. 5A and 5B describe cross sectional configurations of vertically cut surfaces normal to each other. FIGS. 6A to 6D offer cross sectional views taken along the lines VIA, VIB, VIC and VID of FIG. 5A, respectively.

In this spraying nozzle 231X, a plurality of different liquid source materials (or gas-liquid mixtures of liquid source material and carrier gas (e.g., Ar, $N_2$, $H_2$ or the like)) are supplied from the lines 107A, 107B and 107C into supply lines 231A, 231B and 231C, respectively, which are disposed individually in the nozzle. Further, the carrier gas introduced from the line 108 is supplied into the supply line 231D. The supply line 231D communicates with a plurality of diffusion spaces 231D1, 232D2 and 232D3 corresponding to the plurality of liquid source materials. From the respective diffusion spaces, there are extended coaxial paths coaxially formed with the supply lines 231A, 231B and 231C. The liquid source materials supplied by the gas supply lines 231A, 231B and 231C are sprayed to form a mist through the nozzle ports 231a, 231b and 231c by the carrier gas supplied by the coaxial paths.

Figure 10:
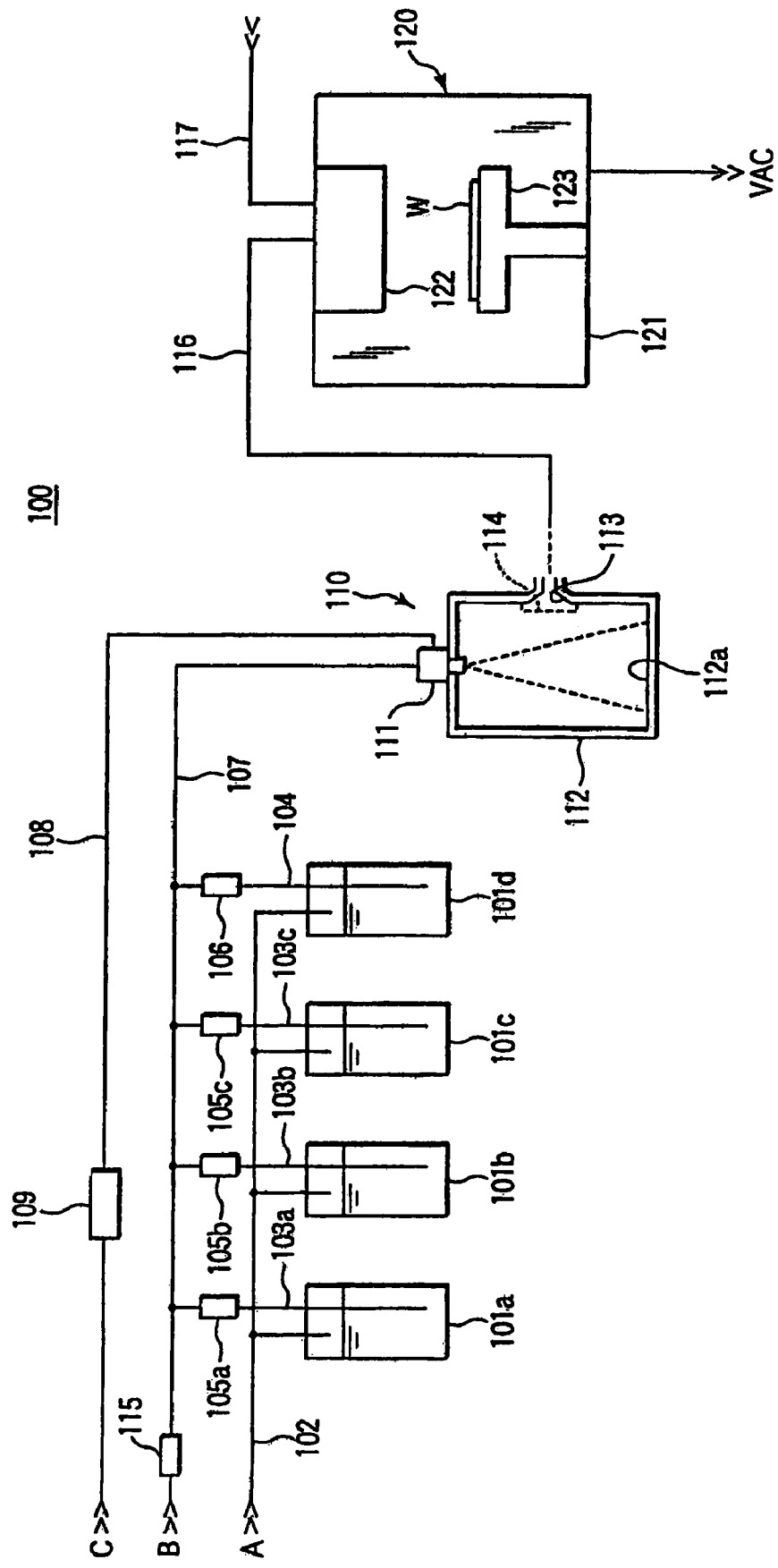
FIG. 10 offers a schematic diagram for showing an entire configuration of a conventional gas reaction apparatus (film forming apparatus).

Since the plurality of liquid source materials are sprayed through the spraying nozzle 231X from the respective nozzle ports, it is unnecessary to mix the liquid source materials in a manifold formed at the main line, as described in FIG. 10. Further, single-purpose nozzle port for each source is prepared, so that spraying condition (spraying amount of the source material, amount of the carrier gas to be mixed, spraying pressure and the like) can be adjusted.

Figure 7A:
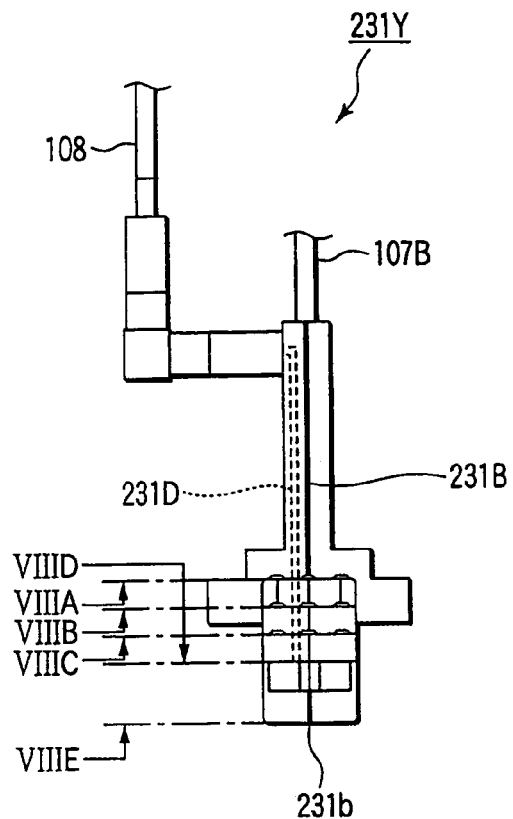
FIGS. 7A and 7B are of a vertical side view and a vertical front view, respectively, for schematically showing another spraying nozzle that may be used in the vaporizers described in FIGS. 2 to 4.
Figure 7B:
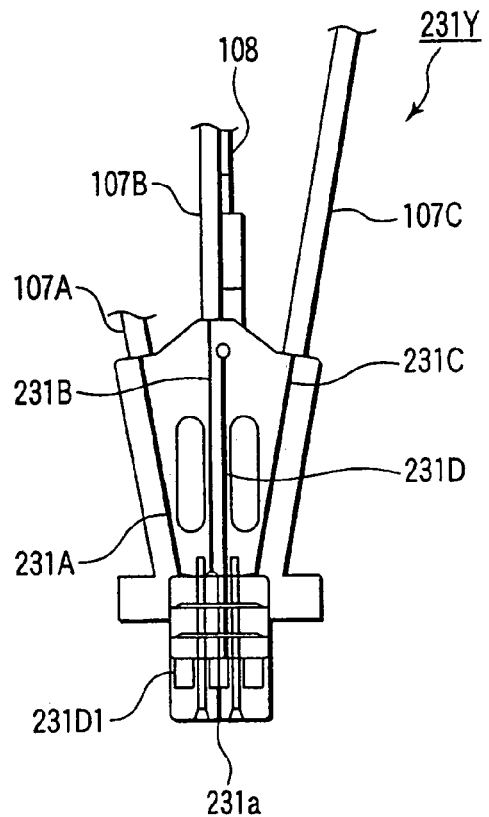
Figure 8A:
FIGS. 8A to 8E show cross sectional views taken along the lines VIIIA, VIIIB, VIIIC, VIIID and VIIIE of FIG. 5A, respectively.
Figure 8B:
Figure 8C:
Figure 8D:
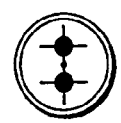
Figure 8E:
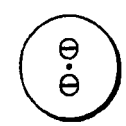

FIGS. 7A and 7B are of a vertical side view and a vertical front view, respectively, for schematically showing additional spraying nozzle that may be used in the vaporizers described in FIGS. 2 to 4. FIGS. 7A and 7B describe cross sectional configurations of vertically cut surfaces normal to each other. FIGS. 8A to 8E present cross sectional views taken along the lines VIIIA, VIIIB, VIIIC, VIIID and VIIIE of FIG. 5A, respectively.

In this spraying nozzle 231Y, a plurality of different liquid source materials (or gas-liquid mixtures of liquid source material and carrier gas) are supplied from the lines 107A, 107B and 107C into the supply lines 231A, 231B and 231C, respectively, which are disposed individually inside the nozzle. Further, the carrier gas introduced from the line 108 is supplied into the supply line 231D. However, the supply lines 231A, 231B and 231C sequentially join a common supply line at the cross sectional positions described in FIGS. 8A to 8C. Further, the supply line 231D communicates with the diffusion space 231D1 corresponding to the common supply line. From the diffusion space 231D1, there is extended a coaxial path coaxially formed with the common supply line. The liquid source material supplied by the common supply line is sprayed to form a mist through the nozzle port 231a by the carrier gas supplied by the coaxial path.

In the spraying nozzle 231Y, the plurality of liquid source materials are mixed therein, so that it is unnecessary to mix the liquid source materials in a manifold formed at the main line, as described in FIG. 10. Further, multiple kinds of source materials can be uniformly mixed, so that the source mixture is vaporized in the vaporizing space to be supplied into the film forming chamber. In this way, reproducibility of the composition ratio of the film is improved.

Figure 9:
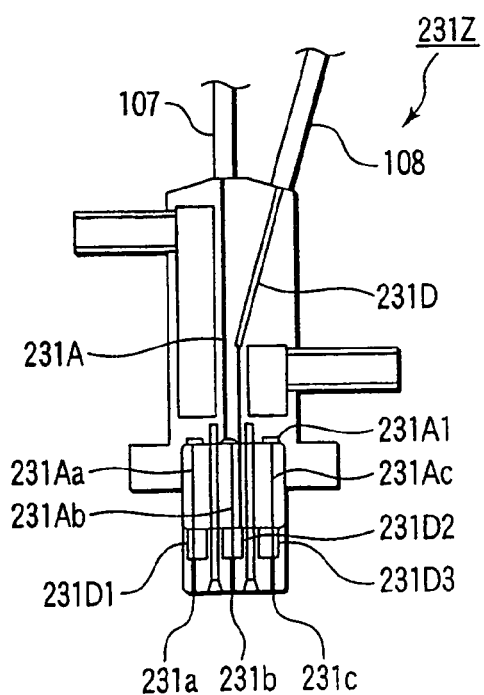
FIG. 9 is a vertical front view for schematically showing still another spraying nozzle that may be used in the vaporizers described in FIGS. 2 to 4.

FIG. 9 is a vertical front view for schematically showing still another spraying nozzle that may be used in the vaporizer described in FIGS. 2 to 4. This spraying nozzle 231Z is an exemplary nozzle configuration using the liquid source supply system described in FIG. 10. Here, as shown in FIG. 10, the liquid source material pre-mixed in the main line 107 is supplied into the supply line 231A in the spraying nozzle 231Z. The supply line 231A communicates with a diffusion space 231A1, from which a plurality of supply lines 231Aa, 231Ab and 231A1c are extended.

Meanwhile, the carrier gas is supplied into the supply line 231D through the line 108, and introduced into plural diffusion spaces 231D1, 231D2 and 231D3. From the diffusion spaces 231D1, 231D2 and 231D3, there are extended multiple coaxial paths, which are coaxially formed with the supply lines 231Aa, 231Ab and 231A1c. The liquid source materials supplied by the supply lines 231Aa, 231Ab and 231Ac are sprayed to form a mist by the carrier gas supplied by these coaxial paths through the nozzle ports 231a, 231b and 231c, respectively.

In case when using this spraying nozzle 231Z, the plurality of liquid source materials are mixed in advance, so that the nozzle can be simply configured. Moreover, since the plural nozzle ports are prepared, the liquid source materials can be efficiently sprayed.

Further, the gas reaction apparatus and the semiconductor processing apparatus in accordance with the present invention are not limited to the aforementioned examples and modifications may be made without departing from the spirit and scope of the invention. For example, in the above-described embodiments, an example of forming the source gas by mixing the plurality of liquid source materials has been explained. However, the number of liquid source materials in accordance with the present invention is not limited, and only a liquid source may be vaporized in the vaporizer.

INDUSTRIAL APPLICABILITY

In accordance with the gas reaction apparatus and the semiconductor processing apparatus of the present invention, the transfer distance of the reaction gas is short, so that high quality gas reaction can be realized, and at the same time, the apparatus can be simply and compactly formed.

What is claimed is:

1. A gas reaction apparatus comprising:
a vaporizer for producing a reaction gas by vaporizing a liquid source material; and
a reaction chamber in which the reaction gas reacts,
wherein the vaporizer is configured as a unit for constituent members forming the reaction chamber, and the reaction gas produced in the vaporizer is directly introduced into the reaction chamber,
wherein the vaporizer includes a spraying nozzle, a vaporizing chamber forming a spraying space of a corresponding spraying nozzle, a narrow passageway communicating with the corresponding vaporizing chamber, a draining unit communicating with the corresponding narrow passageway, and a source gas diffusion space communicating with the draining unit and the reaction chamber, and
wherein a valve body for opening or closing the draining unit is disposed, and a filter for capturing solid or liquid phase materials in the reaction gas is disposed to surround the valve body.

2. The gas reaction apparatus of claim 1, wherein the vaporizer is directly formed at an outer side of a gas introduction unit for introducing the reaction gas into the reaction chamber.

3. The gas reaction apparatus of claim 1, wherein the vaporizer is formed above the reaction chamber.

4. The gas reaction apparatus of claim 1, wherein the narrow passageway is formed of one or more passageways annularly disposed around the vaporizing chamber, and an annular draining passage communicating with the narrow passageway is disposed in the draining unit.

5. The gas reaction apparatus of claim 4, wherein the filter is disposed inside the draining passage.

6. The gas reaction apparatus of claim 5, wherein the filter is disposed at a draining port of the draining passage, which communicates with the reaction chamber.

7. The gas reaction apparatus of claim 5, comprising a heater unit for heating the filter.

8. The gas reaction apparatus of claim 7, wherein the filter makes a thermal contact with an inner surface of the draining passage, and is heated by the heater through the inner surface of the draining passage.

9. The gas reaction apparatus of claim 8, wherein a heat transfer unit is thermally contacted with a portion other than edges of the filter.

10. The gas reaction apparatus of claim 1, comprising a heater unit for heating inner surfaces of the vaporizing chamber and the narrow passageway.

11. A semiconductor processing apparatus, comprising:
a vessel forming a processing chamber for processing a substrate to be processed, the vessel having a upper plate capable of being attached thereto and detached therefrom;
a supporting member, disposed inside the vessel, for supporting the substrate to be processed;
a showerhead for supplying a processing gas into the processing chamber, the showerhead being disposed below the upper plate to face the substrate supported by the supporting member;
a vaporizing chamber, disposed on the upper plate, for producing the processing gas by vaporizing a liquid source material;
a gas passage, configured to communicate with the vaporizing chamber, for flowing the processing gas; and
a draining unit for communicating with the gas passage through the upper plate,
wherein the showerhead includes a source gas diffusion space communicating with the draining unit and the processing chamber, and
wherein a cap is installed on the upper plate and a valve for opening or closing the draining unit is installed at the cap.

12. The semiconductor processing apparatus of claim 11, wherein the vaporizing chamber is formed as a space between the upper plate and the cap.

13. The semiconductor processing apparatus of claim 12, wherein the gas passage includes a narrow passageway formed by a fine gap of 0.5~10.0 mm between the cap and the upper plate, and the narrow passageway serves as a path for vaporizing a mist contained in the processing gas.

14. The semiconductor processing apparatus of claim 13, wherein a protrusion defining a sidewall of the vaporizing chamber is formed on the upper plate, and the narrow passageway is formed between a top surface of the protrusion and an inner surface of the cap.

15. The semiconductor processing apparatus of claim 14, wherein the gas passage includes an annular passageway formed to surround the vaporizing chamber between an outer surface of the protrusion and the inner surface of the cap, and a draining hole is formed at the upper plate towards the showerhead from the annular passageway.

16. The semiconductor processing apparatus of claim 12, wherein there is further included a spraying nozzle, installed at the cap, for spraying the liquid source material into the vaporizing chamber.

17. The semiconductor processing apparatus of claim 12, wherein the upper plate is coupled to a main body of the vessel through a hinge, and the upper plate and the cap rotate as a unit around the hinge as a center with respect to the main body of the vessel.

* * * * *